US006359322B1

(12) United States Patent
Haralson et al.

(10) Patent No.: US 6,359,322 B1
(45) Date of Patent: Mar. 19, 2002

(54) AVALANCHE PHOTODIODE HAVING EDGE BREAKDOWN SUPPRESSION

(75) Inventors: Joe N. Haralson; Kevin F. Brennan, both of Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/550,437

(22) Filed: Apr. 17, 2000

Related U.S. Application Data
(60) Provisional application No. 60/129,474, filed on Apr. 15, 1999.

(51) Int. Cl.$^7$ ............................................. H01L 31/107
(52) U.S. Cl. .......................... 257/438; 257/21; 257/184; 438/93; 438/96; 438/99
(58) Field of Search .......................... 257/21, 184, 185, 257/186, 438, 603; 438/93, 96, 99

(56) References Cited

U.S. PATENT DOCUMENTS

| | | | | | |
|---|---|---|---|---|---|
| 4,587,544 A | * | 5/1986 | Webb | ........................... | 357/30 |
| 5,346,837 A | * | 9/1994 | Funaba | ........................... | 437/3 |
| 5,369,292 A | * | 11/1994 | Yoo et al. | ................... | 257/186 |
| 5,654,578 A | * | 8/1997 | Watanabe | ................... | 257/438 |

FOREIGN PATENT DOCUMENTS

JP            57159072 A   * 10/1982

OTHER PUBLICATIONS

Joe N. Haralson, II and Kevin F. Brennan; "Novel Edge Suppression Technique for Planar Avalanche Photodiodes;" *IEEE Journal of Quantum Electronics*; Dec. 1999; pp. 1863–1869.

L.E. Tarof, et al.; "Planar InP–InGaAs Single–Growth Avalanche Photodiodes with No Guard Rings," *IEEE Photonics Technology Letters*; Nov. 1995; pp. 1330–1332.

Ghulam Hasnain, et al.; "Buried–Mesa Avalanche Photodiodes;" *IEEE Journal of Quantum Electronics*; pp. 2321–2326.

M.J. Deen and L.E. Tarof; "Multiplication in Separate Absorption, Grading, Charge, and Multiplication InP–InGaAs Avalanche Photodiodes;" *IEEE Journal of Quantum Electronics*; Nov. 1995; pp. 2078–2089.

L.E. Tarof, et al.; "High–Frequency Performance of Separate, Absorption Grading, Charge, and Multiplication InP/InGaAs Avalanche Photodiodes;" *IEEE Photonics Technology Letters*; pp. 672–674.

L.E. Tarof; "Planar InP/GaAs Avalanche Photodetector with Gain–Bandwidth Product in Excess of 100 GHz;" Jan. 1991; pp. 34–36.

(List continued on next page.)

*Primary Examiner*—Nathan Flynn
*Assistant Examiner*—Remmon R. Fordé
(74) *Attorney, Agent, or Firm*—Thomas, Kayden, Horstemeyer & Risley, LLP

(57) ABSTRACT

The present disclosure relates to an avalanche photodiode having edge breakdown suppression. The photodiode comprises a p contact and an n contact, as well as a plurality of device layers disposed between the p contact and the n contact. The device layers include, in order from the p contact to the n contact, a primary well, a decoupler layer, a multiplication layer, a charge sheet, an absorption layer, and a substrate. The layers are constructed so as to have particular volumes of charge which affects the order in which they deplete. With the preferred order of depletion, the multiplication layer will deplete before the decoupler layer and the decoupler layer will deplete before the charge sheet when a negative bias is applied to the avalanche photodiode. This results in a joint opening effect within the avalanche photodiode which effectively suppresses edge breakdown.

16 Claims, 10 Drawing Sheets

OTHER PUBLICATIONS

L.E. Tarof, et al.; "Planar InP/InGaAs Avalanche Photodetectors with Partial Charge Sheet in Device Periphery;" *Appl. Phys. Lett. 57*; Aug. 1990; pp. 670–672.

L.E. Tarof; "Planar InP–InGaAs Avalanche Photodectors with n⁻ Multiplication Layer Exhibiting a Very High Gain –Bandwidth Product;" *IEEE Photonics Technology Letters*; Sep. 1990; pp. 643–646.

Nobuhiko Susa, et al., "New InGaAs/InP Avalanche Photodiode Structure for the 1–1.6μm Wavelength Region;" *IEEE Journal of Quantum Electronics*; pp. 864–870.

Kenko Taguchi, et al.; "Planar InP/InGaAs Avalanche Photodiodes with Preferential Lateral Extended Guard Ring;" *IEEE Electron Device Letters*; Apr. 1986, pp. 257–258.

A.J. Moseley, et al.; "High Speed InP/InGaAs Photodiodes for Applications to 40GHz;" *SPIE vo. 995 High Frequency Analog Communications*; pp. 61–67.

Tatsunori Shirai, et al.; "A Planar InP/InGaAs Heterostructure Avalanche Photodiode;" *IEEE Transactions on Electron Devices*; Sep. 1982; pp. 1404–1407.

G.C. Chi, et al.; "Planar Avalanche Photodiode with a Low–Doped, Reduced Curvature Junction;" *Appl. Phys. Lett.*; pp. 1158–1160.

Y. Matsushima, et al.; "High–Speed Response InGaAs/InP Heterostructure Avalanche Photodiode with InGaAsP Buffer Layers;" *Electronic Letters*; Oct. 1982; pp. 945–946.

Y. Matsushima, "High Sensitivity of VPE–Grown InGaAs/InP–Heterostructure APD with Buffer Layer and Guard–Ring Structure;" *Electronics Letters*; Mar. 1984; pp. 235–236.

Y. Liu and S. R. Forrest; "Simple, Very Low Dark Current, Planar Long–Wavelength Avalanche Photodiode;" *Appl. Phys. Lett.*; Oct. 1988; pp. 1311–1313.

Jim Rue, et al.; "High Performance 10Gb/s Pin and APD Optical Receivers".

Mark A. Itzler, et al.; "Planar Bulk–InP Avalanche Photodiode Design for 2.5 and 10Gb/s Applications," *ECOC '98*, 20–24; Sep. 1998.

Mark A. Itzler, et al.; "Manufacturable Planar Bulk–InP Avalanche Photodiodes for 10 Gb/s Applications"; *LEOS '99*, Nov. 8–11; 1999.

Kenko Taguchi, et al.; "Planar–Structure InP/InGaAsP/InGaAs Avalanche Photodiodes with Preferential Lateral Extended Guard Ring for 1.0–1.6 μm Wavelength Optical Communication Use;" *Journal of Lightwave Technology*; Nov. 1988, pp. 1643–1655.

K.F. Li, et al.; "Avalanche Multiplication Noise Characteristics in Thin GaAs p+–i–n+ Diodes;" *IEEE Transactions of Electron Devices*; Oct. 1998; pp. 2102–2107.

D.S. Ong, et al.; "A Monte Carlo Investigation of Multiplication Noise in Thin p+–i–n+ GaAs Avalanche Photodiodes;" *IEEE Transaction on Electron Devices*; Aug. 1998; pp. 1804–1810.

K.F. Li, et al.; "Low Avalanche Noise Characteristics in Thin InP p+–i–n+ Diodes with Electron Initiated Multiplication;" *IEEE Photonics Technology Letters*; Mar. 1999; pp. 364–366.

J. Harari, et al.; "Numerical Simulation of Avalanche Photodiodes with Guard Ring;" *IEE Proceedings*; Jun. 1991; pp. 211–217.

Hiromi Sudo and Masamitsu Suzuki; "Surface Degradation Mechanism of InP/InGaAs APD's;" *Journal of Lightwave Technology*; Oct. 1988; pp. 1496–1501.

A.H. Gnauck, et al.,"A Transimpedance APD Optical Receiver Operating at Gb/s;" *IEEE Photonics Technology Letters*; May 1992; pp. 468–470.

J.N. Haralson, II, et al.; "Numerical Simulation of Avalanche Breakdown within InP–InGaAs SAGCM Standoff Avalanche Photodiodes;" *Journal of Lightwave Technology*; Nov. 1997; pp. 2137–2140.

D.E. Ackley, et al.; "$In_{0.53}$As/InP Floating Guard Ring Avalanche Photodiodes Fabricated by Double Diffusion;" *IEEE Photonics Technology Letters*; Aug. 1990; pp. 571–573.

Y. Liu, et al.; "A Planar InP/InGaAs Avalanche Photodiode with Floating Guard Ring and Double Diffused Junction;" *Journal of Lightwave Technology*; Feb. 1992; pp. 182–193.

Kenko Taguchi, et al.; "Planar–Structure InP/InGaAsP/InGaAs Avalanche Photodiodes with Preferential Lateral Extended Guard Ring for 1.0–1.6 μm Wavelength Optical Communication Use;" *Journal of Lightwave Technology*; Nov. 1998; pp. 1643–1665.

Joseph W. Parks, Jr. and Kevin F. Brennan; "Numerical Examination of Silicon Avalanche Photodiodes Operating in Charge Storage Mode;" *IEEE Transactions on Electron Devices*; Feb. 1998; pp. 394–400.

Joseph W. Parks, et al.; "Theoretical Study of Device Sensitivity and Gain Saturation of Separate Absorption, Grading, Charge, and Multiplication InP/InGaAs Avalanche Photodiodes;" *IEEE Transactions on Electron Devices*; Dec. 1996; pp. 2113–2121.

\* cited by examiner

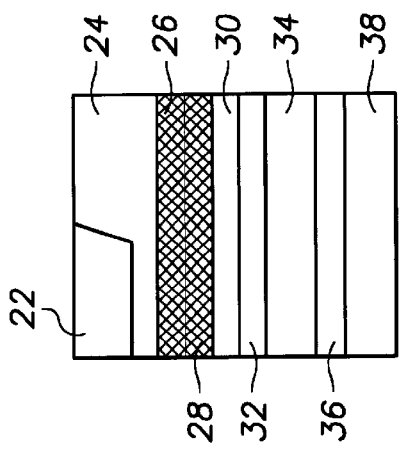
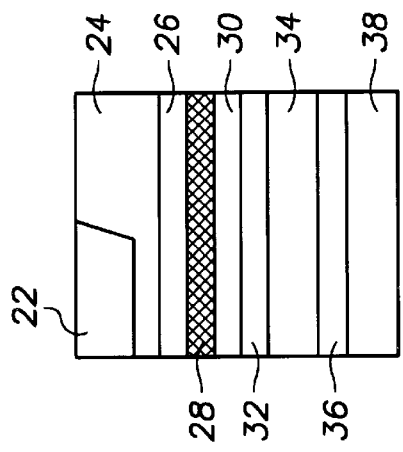
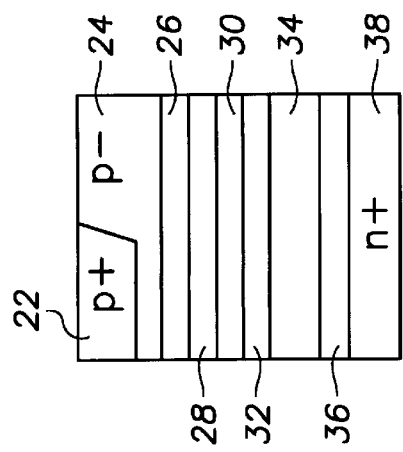
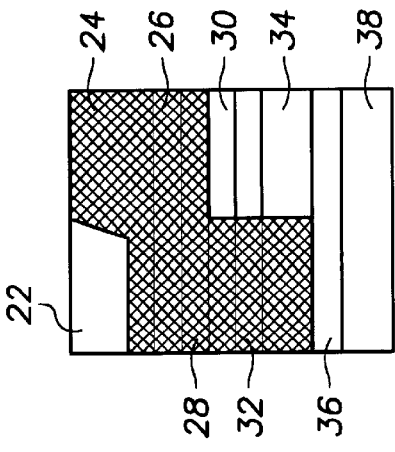
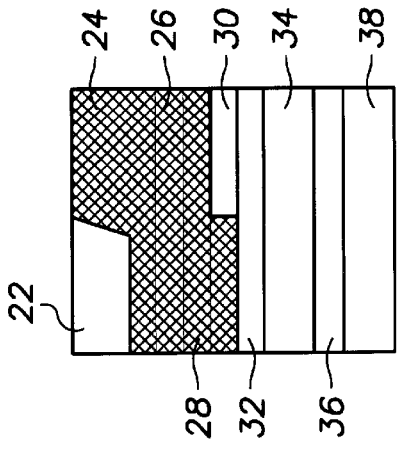
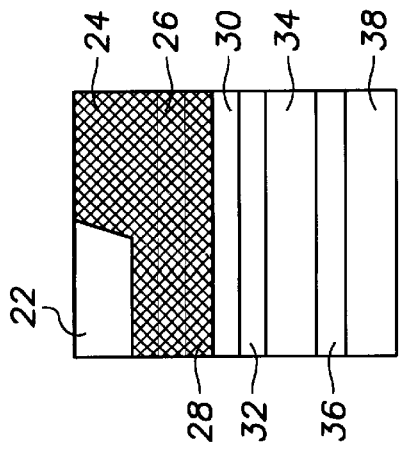

AVALANCHE PHOTODIODE HAVING EDGE BREAKDOWN SUPPRESSION

CLAIM OF PRIORITY

This application claims priority to, and the benefit of the filing date of, copending U.S. provisional application entitled, "Joint Opening Effect Avalanche Photodiode," having Ser. No. 60/129,474, filed Apr. 15, 1999, which is entirely incorporated herein by reference.

FIELD OF THE INVENTION

The present disclosure relates to an avalanche photodiode having edge breakdown suppression. More particularly, the disclosure relates to an avalanche photodiode which is configured so as to undergo a predetermined sequence of depletion which suppresses edge breakdown.

BACKGROUND OF THE INVENTION

The internal gain provided by avalanche photodiodes (APDs) allows for the reduction or elimination of more noisy external amplifiers in optical detection systems. For this reason, avalanche photodiodes are attractive for use in detection applications that require optical gain. Such applications include, for instance, use in telecommunications networks, range finders, biomedical imagers, and scintillation detectors.

As is known in the art, planar avalanche photodiodes typically are easier to passivate than mesa avalanche photodiodes in that planar avalanche photodiodes do not need to be etched during the manufacturing process as do mesa avalanche photodiodes. This translates into improved reliability for planar avalanche photodiodes. For this reason, it is generally regarded as desirable to use planar avalanche photodiodes whenever possible. Despite their advantages over mesa avalanche photodiodes, planar avalanche photodiodes often suffer from edge breakdown. Edge breakdown refers to the phenomenon in which the carrier generation rate at the edge of the avalanche photodiode is substantially larger that that of the center region of the avalanche photodiode. This phenomenon is graphically illustrated in FIG. 1 which shows the carrier generation rate over a radial section of a conventional avalanche photodiode. As indicated in this figure, a spike in the graph occurs adjacent the edge of the device, indicating an edge breakdown condition. With this concentration of carrier generation occurring at the edge of the avalanche photodiode, a relatively high current exists in a relatively small region. This condition suppresses the amount of gain that can be obtained from the device. In addition, this condition further negatively affects device reliability, illuminated and dark current-voltage (I-V) characteristics, leakage current, noise, and yield.

In view of the above, the location of avalanche breakdown is of major concern in the design of planar avalanche photodiodes. Of paramount importance to avoiding edge breakdown (and achieving center breakdown) is the electric field distribution within the avalanche photodiode because impact ionization has an exponential dependence on electric field. The field dependence of the ionization coefficient $\alpha_{n,p}$, is given by $$\alpha_{n,p} = \alpha_{n,p}^{\infty} \cdot \exp\left(-\left(\frac{E_{n,p}^{crit}}{E^*}\right)^{\beta^{n,p}}\right) \quad \text{[Equation 1]}$$

$$E^* = \frac{|\vec{E} \cdot \vec{J}_{n,p}|}{|\vec{J}_{n,p}|}. \quad \text{[Equation 2]}$$

These equations show that the generation rate due to impact ionization is also exponentially dependent on the flux of the carriers entering the high field regions in [1] and [2], where $\vec{J}_n$ and $\vec{J}_p$ are the electron and hole current densities, $\vec{E}$ is the electric field, and $E^*$ is the electric field in the direction of the current density. The variables $\beta_n$, $\beta_p$, $\alpha_n^{\infty}$, $\alpha_p^{\infty}$, $E_n^{crit}$, and $E_p^{crit}$ are experimentally determined parameters that characterize the ionization coefficients.

In order to improve device reliability and reduce leakage currents, avalanche photodiodes must be designed so the impact ionization in the center region of the avalanche photodiode dominates the breakdown process. Currently, there are three primary techniques used for suppressing edge breakdown in planar avalanche photodiodes. The first technique relies on altering the geometry at the edge of the well structure in such a way as to reduce the electric field strength in that region. Examples of this technique include the use of doubly diffused wells, pre-etched wells, and guard rings. Of these three examples, by far the most common approach is the use of guard rings. As known in the art, guard rings are rings of material having a different dopant level which are formed around the periphery of the avalanche photodiode. When a guard ring is correctly formed, its presence changes the electric field profile of the avalanche photodiode to suppress edge breakdown. Unfortunately, the desired electric field profile is often difficult to obtain in that guard ring designs are sensitive to the depth of implantation and the dose of the implant. In terms of implantation depth, if the implant is too deep, tunneling will occur in the absorption layer. If, on the other hand, the implant is too shallow, then edge breakdown will occur. Similarly, incorrect dopant levels can prevent the guard ring from effectively suppressing edge breakdown.

The second known edge suppression technique relies on redistribution of the equipotential regions near the well edge. Single and double floating guard rings are examples of this method. Floating guard ring designs typically require at least two wells (primary and floating) to achieve center breakdown. In that the location of breakdown is highly dependant upon the lateral position of the floating guard ring, edge breakdown may still occur at the edge of the primary well if the guard ring is fabricated too close to the primary well.

The third edge suppression technique confines the highest electric field to the center of the well away from the edges by introducing a charged disc underneath the well. Two tiered charge sheets are representative of this approach. The two-tiered charge sheet suppression technique is advantageous since it only requires surface processing related to the formation of the primary well. However, additional complexities arise in the fabrication of the mesa charge disc. For instance, the avalanche photodiode must be removed from the growth chamber and then etched to form the mesa. This makes it a two-growth process which requires realignment of the device for the second growth step. As known in the art, the interruption of the growth process increases the difficulty of obtaining good yield, high reliability, and proper leakage current.

Conventional edge breakdown suppression techniques can also negatively impact device capacitance. The capacitance in planar avalanche photodiodes is proportional to the width of the well and is inversely proportional to the depth of the depletion beneath the well. Most edge breakdown suppression mechanisms rely on altering the geometry of the primary well. This is the case with guard ring and dual diffusion designs. Altering the geometry of the well edge results in increase in the effective area of the well. This, in turn, results in higher device capacitance. Although avalanche photodiodes with buried charge sheets do not alter the primary well geometry, the primary well must be wider than the width of the buried charge sheets. This increases the well area needed for a given active region width and subsequently also increases the device capacitance.

In addition to capacitance, conventional edge breakdown suppression techniques generally increase the dark current. This occurs with the guard ring and buried charge sheet techniques because these techniques deplete a larger volume of the absorption region than is needed for photon detection. Since the absorption region is generally made from a material with a smaller bandgap than the multiplication region, the majority of the dark current comes from the depleted absorption region.

From the foregoing, it can be appreciated that it would be desirable to have an avalanche photodiode which effectively suppresses edge breakdown and which does not suffer from the disadvantages highlighted in the foregoing.

SUMMARY OF THE INVENTION

The present disclosure relates to an avalanche photodiode having edge breakdown suppression. The photodiode comprises a p contact and an n contact, as well as a plurality of device layers disposed between the p contact and the n contact. The device layers include, in order from the p contact to the n contact, a primary well, a decoupler layer, a multiplication layer, a charge sheet, an absorption layer, and a substrate.

The layers are constructed so as to have particular volumes of charge which affects the order in which they deplete. For instance, the multiplication layer has a volume of charge less than that of the decoupler layer, and the decoupler layer has a volume of charge less than that of the charge sheet. With this construction, the multiplication layer will deplete before the decoupler layer and the decoupler layer will deplete before the charge sheet when a negative bias is applied to the avalanche photodiode. This results in a joint opening effect within the avalanche photodiode which effectively suppresses edge breakdown.

The present disclosure further relates to a method for suppressing edge breakdown in an avalanche photodiode which comprises applying a negative bias to the avalanche photodiode at its p contact, increasing the bias such that a multiplication layer of the avalanche photodiode is first depleted, further increasing the bias such that a decoupler layer of the avalanche photodiode is depleted, and further increasing the bias such that a center region of a charge sheet of the avalanche photodiode is depleted. This sequence of depletion creates a joint opening effect which suppresses edge breakdown.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

FIGS. 3A–3F are schematic representations of the depletion progression and sequence within the avalanche photodiode of FIG. 2.

DETAILED DESCRIPTION

Figure 1:
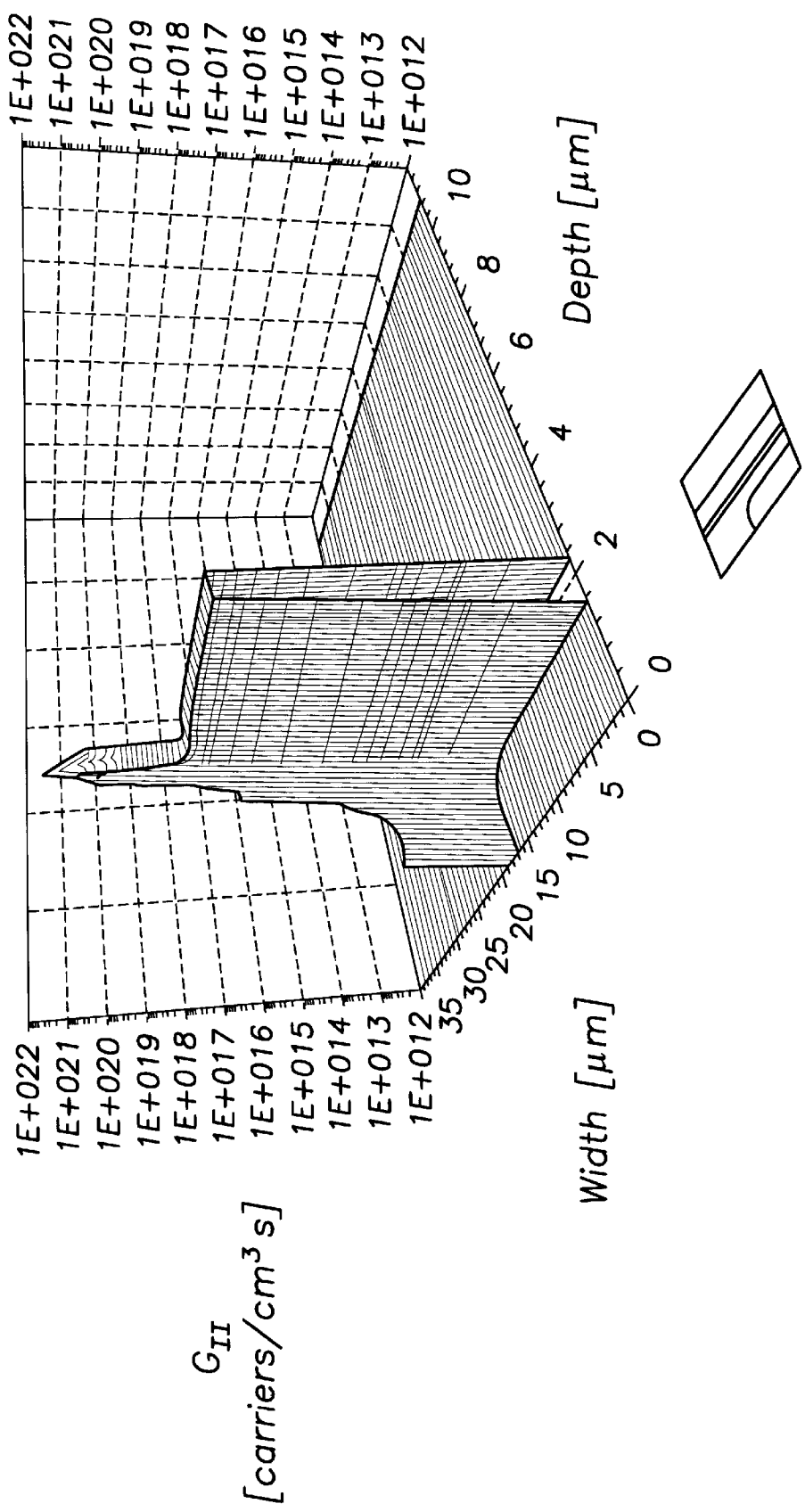
FIG. 1 is a graph of the electric field over a radial section of a conventional avalanche photodiode.
Figure 2:
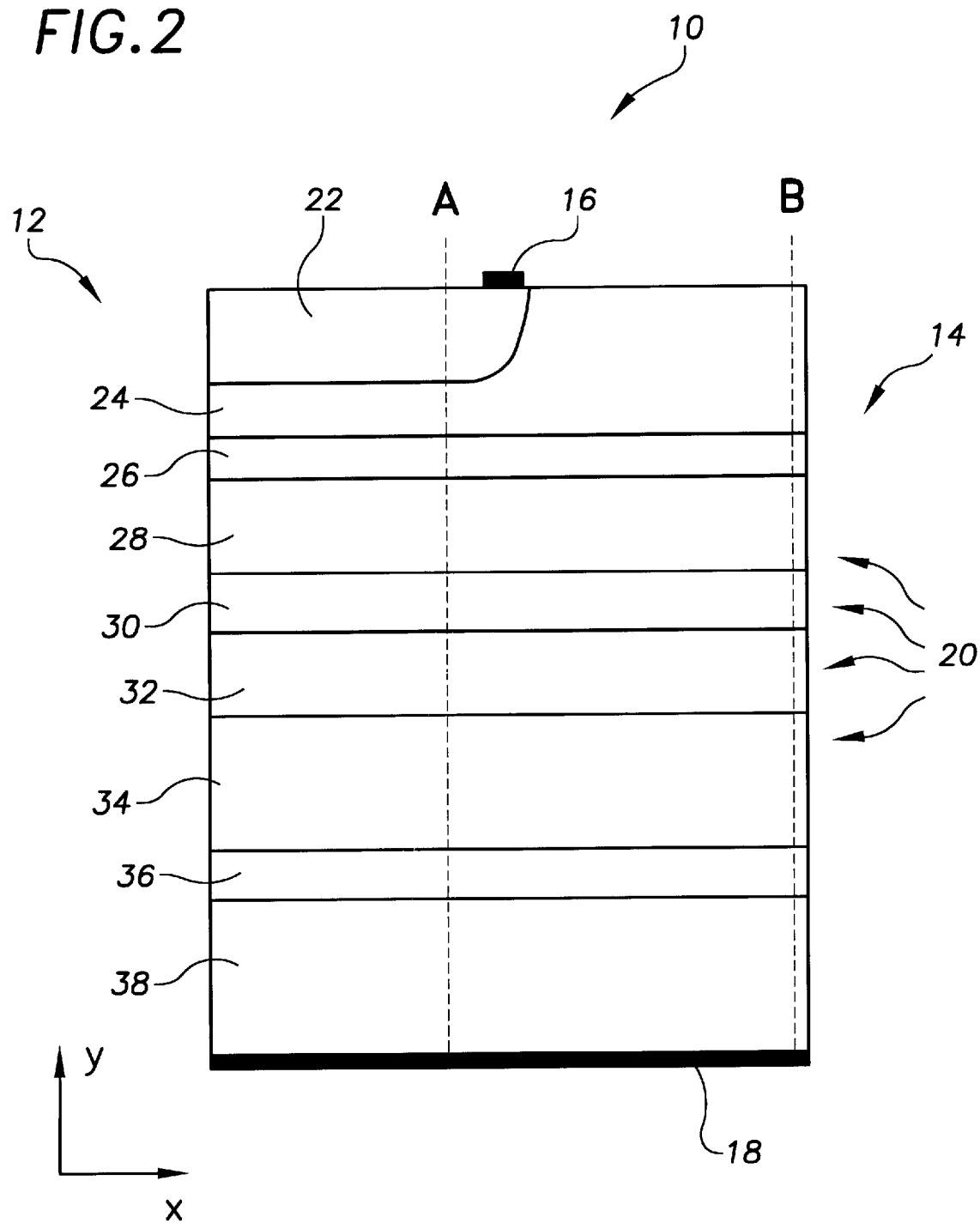
FIG. 2 is a partial cross-sectional view of an avalanche photodiode constructed in accordance with the principles of the present invention.

Referring now in more detail to the drawings, in which like numerals indicate corresponding parts throughout the several views, FIG. 2 illustrates a cross-section of an avalanche photodiode 10 constructed in accordance with the principles of the present invention. More particularly, shown is a radial cross-section of the avalanche photodiode from the axial center 12 of the device to the peripheral edge 14 of the device. Accordingly, the avalanche photodiode 10 is generally cylindrical in shape. Despite this configuration, persons having ordinary skill in the art will appreciate that alternative geometric configurations are possible and may even be preferable in particular applications.

As indicated in FIG. 2, the avalanche photodiode 10 generally comprises a p contact 16, an n contact 18, and a plurality of device layers 20 which are disposed in a predetermined sequence between the p and n contacts 16 and 18. In particular, the various layers 20 of the device comprise, in order from the p contact 16 to the n contact 18, a primary well 22, a separator layer 24, a decoupler layer 26, a multiplication layer 28, a charge sheet 30, a graded layer 32, an absorption layer 34, a buffer layer 36, and a substrate 38. Where the avalanche photodiode 10 is generally cylindrical in shape, each of these layers 20 is substantially circular in cross-section.

In a preferred arrangement, the avalanche photodiode 10 is formed as an InGaAs-InP photodiode. In this case, each of the primary well 22, separator layer 24, decoupler layer 26, multiplication layer 28, charge sheet 30, graded layer 32, buffer layer 36, and substrate 38 comprise indium phosphide (InP), while the absorption layer 34 comprises indium gallium arsenide (InGaAs). The graded layer 32 is formed by any of the methods consistent with the art for grading in from InP to InGaAs. The relative doping levels and thicknesses of the various layers has a critical impact on the performance received from the photodiode 10. In terms of doping, the primary well 22 is highly p-type, the separator layer 24 is lightly p-type, the decoupler layer 26 is highly p-type, the multiplication layer 28 is lightly n-type or p-type, the charge sheet 30 is highly n-type, the graded layer 32 is lightly n-type, the absorption layer 34 is lightly n-type, the buffer layer 36 is lightly n-type, and the substrate 38 is highly n-type. Depending on the material system chosen, the n-type and p-type regions can be reversed such that the layers previously identified as p-type could be n-type and vice versa. By way of example, particularly advantageous results can be obtained with an avalanche photodiode having the dimensions and dopant concentrations identified in Table I.

TABLE I

Example Layer Thicknesses and Doping Concentrations

| Layer | Thickness | Dopant Concentration |
|---|---|---|
| Primary well | 1.70 μm | $N_A = 5 \times 10^{18}$ cm$^{-3}$ |
| Separator layer | 1.00 μm | $N_A = 7 \times 10^{14}$ cm$^{-3}$ |
| Decoupler layer | 0.12 μm | $N_A = 2 \times 10^{17}$ cm$^{-3}$ |
| Multiplication layer | 0.30 μm | $N_D = 7 \times 10^{14}$ cm$^{-3}$ |
| Charge sheet | 0.12 μm | $N_D = 2.9 \times 10^{17}$ cm$^{-3}$ |
| Graded layer | 0.09 μm | $N_D = 2 \times 10^{16}$ cm$^{-3}$ |
| Absorption layer | 3.30 μm | $N_D = 7 \times 10^{14}$ cm$^{-3}$ |
| Buffer layer | 0.50 μm | $N_D = 7 \times 10^{14}$ cm$^{-3}$ |
| Substrate | 3.88 μm | $N_D = 7 \times 10^{18}$ cm$^{-3}$ |

While Table I provides specific parameters for the thickness and dopant concentration of each layer 20 of the avalanche photodiode 10, it is to be understood that these parameters are provided for purposes of example only. Instead, it is the relative volume of charge of each layer 20 that is of importance. As is known in the art, the charge volume of each layer 20 is directly proportional to the layer's thickness and the degree to which it has been doped. Accordingly, the thicker the layer and/or the greater the doping, the greater the charge volume that will be obtained. Further known in the art is that photodiode layers having lesser volumes of charge will deplete prior to those having greater volumes of charge. Because of this fact, the sequence in which a photodiode is depleted can be controlled by altering the volumes of charge of the various photodiode layers relative to each other. Integral to the success of the avalanche photodiode of the present invention is the design of the various volumes of charge of each device layer 20 so as to control the sequence in which these layers 20 are depleted. This sequence can be used to create a joint opening effect (JOE) which, as is described below, suppresses edge breakdown of the device.

To obtain the desired sequence of depletion for the avalanche photodiode 10, the multiplication layer 28 has a lower volume of charge than the decoupler layer 26, which has a lower volume of charge than the charge sheet 30. With these relative volumes of charge, the avalanche photodiode will deplete in the same order. Specifically, the multiplication layer 28 will deplete before the decoupler layer 26, which will deplete before the charge sheet 30. As illustrated by Table I, this sequence of depletion can be obtained, for example, by increasing doping concentrations in this same sequence. Accordingly then, the multiplication layer 28 can have a lower dopant concentration than the decoupler layer 26, which can have a lower dopant concentration that the charge sheet 30. It is important to recognize that the dopant type in layer 26 is opposite that in layer 30.

FIGS. 3A–3F are sequential schematic representations depicting depletion of the avalanche photodiode 10 shown in FIG. 2. These figures identify the progression and sequence of depletion of the various layers 20 of the photodiode 10 with cross-hatching as bias is increased. FIG. 3A shows the avalanche photodiode 10 before a bias is applied thereto such that none of the device layers 20 are depleted. In FIG. 3B, the photodiode 10 is initially depleted with the application of a low negative bias to the p contact 16. Because of its relatively light doping, the multiplication layer 28 is the first layer to deplete as indicated with cross-hatching in FIG. 3B. As the bias is increased, the decoupler layer 26 (which has a volume of charge less than that of the charge sheet 30) is the next to be depleted as shown in FIG. 3C. Next, the lightly doped separator layer 24 is depleted as indicated in FIG. 3D. Once the separator layer 24 is depleted, further application of negative bias will result in the partial depletion of the charge sheet 30. In particular, a central region of the charge sheet 30 (which coincides with the radial extent of the primary well 22) will be depleted as depicted in FIG. 3E. The peripheral region (to the right in FIG. 3E of the central region) of the charge sheet 30 does not deplete since there is no longer any p-type charge directly above this portion of the charge sheet 30. With the application of yet more bias, depletion continues from the central region of the charge sheet 30 downwardly through the graded layer 32 and the absorption layer 34.

The depletion progression and sequence described above results in effective suppression of edge breakdown. To exhibit the advantages provided by the joint opening effect, a computational study was performed. The study was conducted using an advanced drift-diffusion subset of the semiconductor total energy balance in a STEBS-2-D simulator. This simulator provides a self-consistent solution to the electron and hole continuity equations and the Poisson equation. The results of the study, as well as a more detailed explanation of the depletion progression and sequence, is provided in the following discussion.

Figure 4:
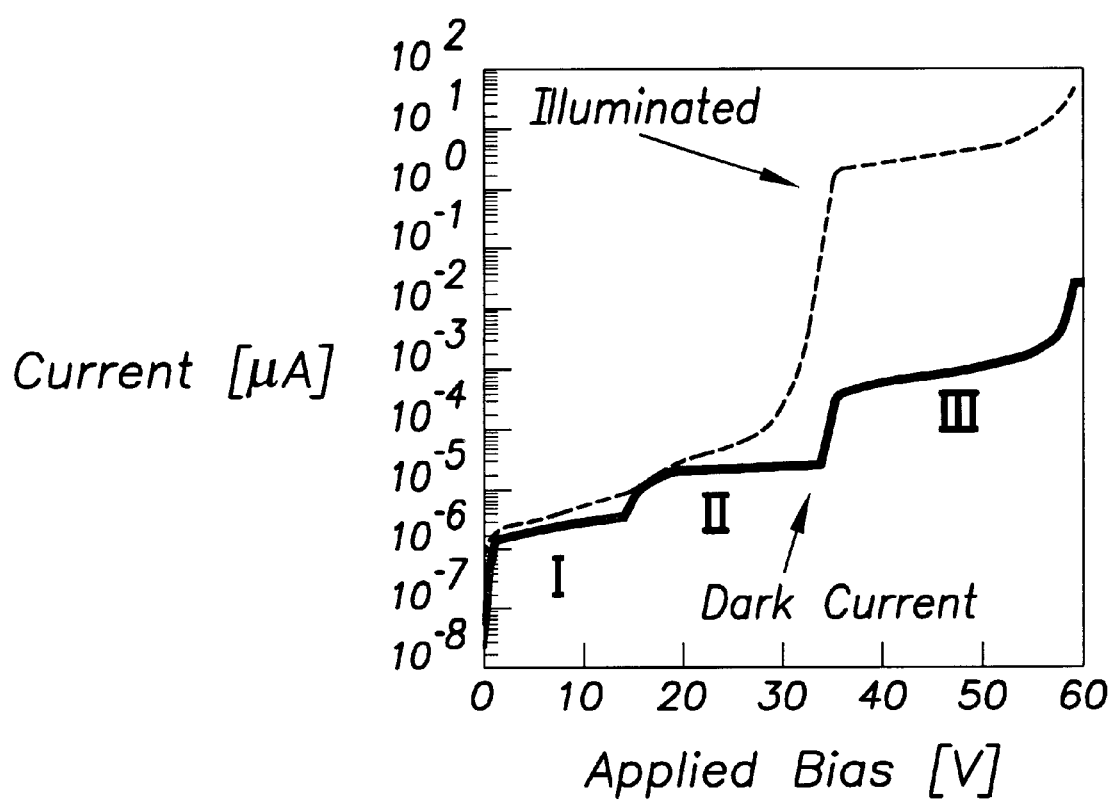
FIG. 4 is a graph of the illuminated and dark current-voltage (I-V) characteristics of the avalanche photodiode shown in FIG. 2.

The influence of the applied bias on photocurrent and dark current in the basic JOE avalanche photodiode is shown in FIG. 4. From this figure, it can be seen that there are three distinct modes of operation for this device. When the JOE avalanche photodiode is in Mode I, it operates as a p-i-n photodiode, while Mode III corresponds to the classic behavior associated with avalanche photodiodes. Mode II is a hybrid of Modes I and III. In this mode, the device performance corresponds to that of a p-i-n diode with a larger depletion region. In addition, it is possible to have impact ionization while in Mode II.

Figure 5:
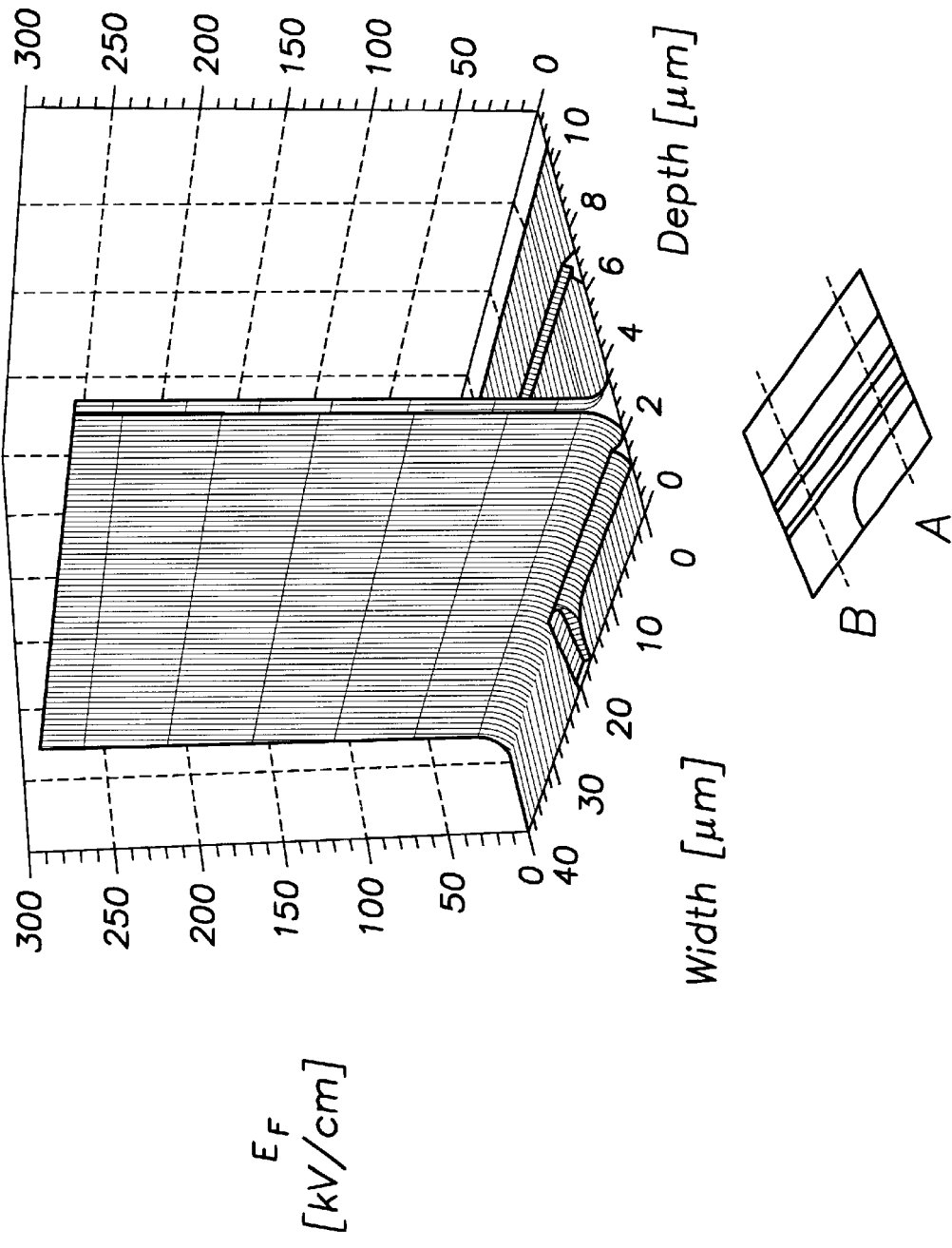
FIG. 5 is a graph of the electric field over a partial section of the avalanche photodiode shown in FIG. 2 under an applied negative bias of 10 V.

To understand why these modes arise as well as to clarify how this avalanche photodiode operates, it is instructive to start with an unbiased device and examine how it changes as the bias is increased. When a bias is applied to the device, the potential is initially dropped at the junction between the p+ decoupler layer 26 and the n-type multiplication layer 28. The n-type multiplication layer 28 is rapidly depleted until the n+ charge sheet 30 is reached. Under these conditions, the potential drop is confined to the region between the p+ and n+ charge sheets. The electric field profile is linear with a slope set by the initial dopant type and density within the multiplication region in the same manner as is encountered in the intrinsic region of a basic p-i-n photodiode. This is the primary electric field buildup and it occurs uniformly throughout this region. At this point, the device operates in Mode I and the magnitude of the electric field within the device is shown in FIG. 5 with 10-V applied bias.

The primary electric field continues to grow as the bias is increased. During this time, the central region of the n+ charge sheet 30 is further depleted. This continues until the central region of the charge sheet 30 is completely depleted. This marks the beginning of Mode II operation as shown in FIG. 4. As the lightly doped p-type separator layer 24 is depleted, the primary well 22 is exposed, thereby altering the field growth in the device and defining the active (center) region therein. The variation in the electric field profile laterally along the x axis of the device is a direct result of the non-uniform distribution of charge in the top layer, which is produced by the diffusion or implantation of the p+ well. The electric field growth along the y axis of the device can be separated into two distinct sections labeled A and B in FIG. 2. There is only a small amount of charge in the top layer within section B of the device. When the potential is increased, this charge is rapidly depleted, thus extending the distance over which the potential is dropped. This slows the growth rate of the electric field in the device perimeter, as is indicated in FIG. 6.

The field growth around the perimeter (section B) of the JOE avalanche photodiode is in direct contrast to the electric field buildup in the center of the device (section A) which includes the p+ primary well 22. Since the primary well 22 is heavily doped, there is only minimal depletion into the well geometry. This allows for continued rapid field growth in the active region, since the potential is dropped over a shorter distance than in section B. In this way, the principal (within the center of the device) and auxiliary (within the perimeter of the device) electric fields are established in the multiplication layer 28. The principal and auxiliary electric fields within the multiplication layer 28 are clearly illustrated in FIG. 6. The transition from principle to auxiliary electric field occurs at a lateral distance of approximately 16 μm.

Figure 6:
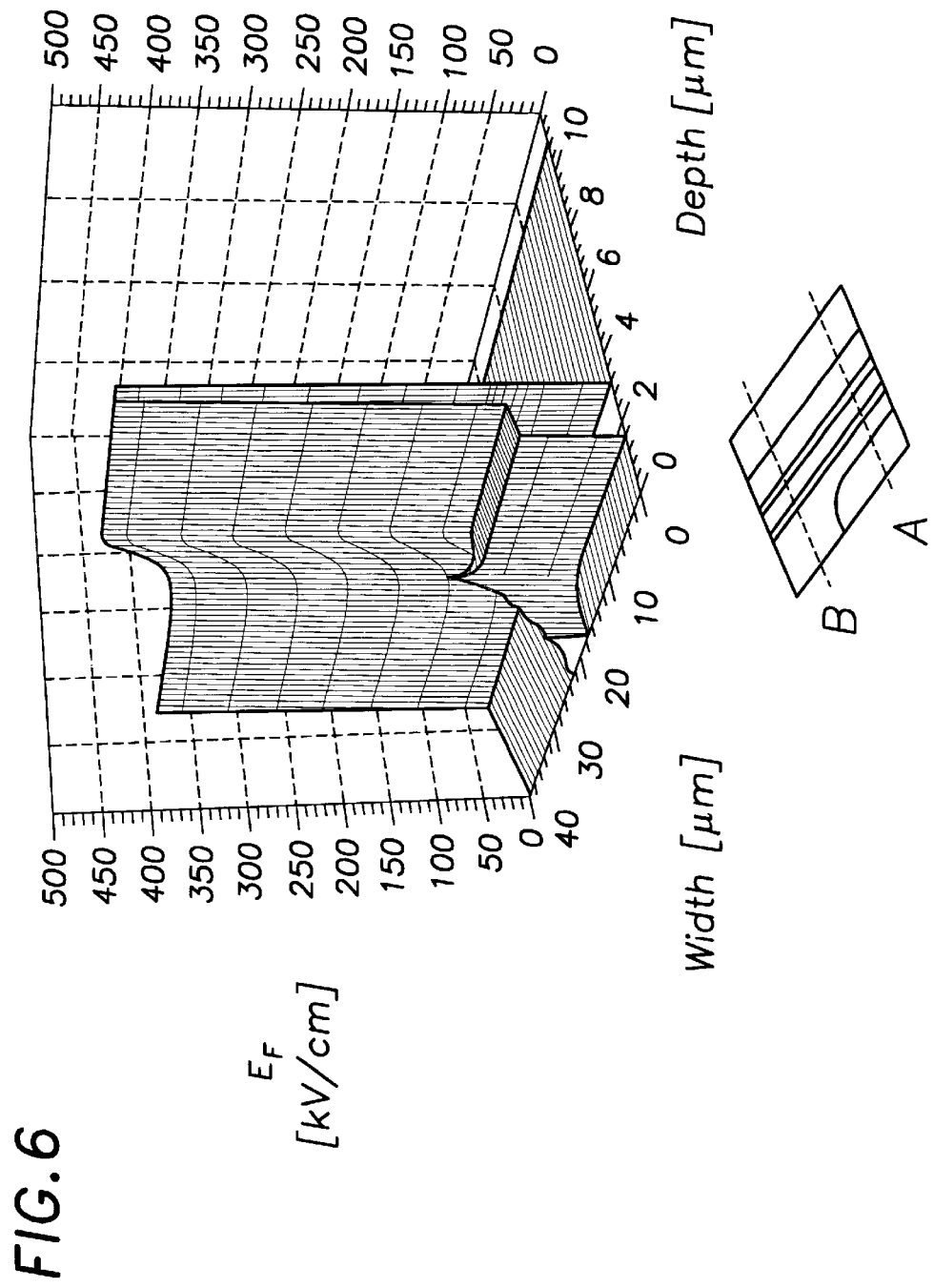
FIG. 6 is a is a graph of the electric field over a partial section of the avalanche photodiode shown in FIG. 2 under an applied negative bias of 30 V.

In addition to the separation of the principal and auxiliary fields, FIG. 6 shows the electric field growth in the top layer between the multiplication layer 28 and the primary well 22 that will serve to accelerate the collection of carriers. Also of interest in FIG. 6 is the formation of the field spike at the corner of the primary well 22. It is evident that the delayed opening of the p+ decoupler layer 26 leads to a diminished electric field at the corner of the primary well 22. The spike is spatially separated from the active region. The joint opening effect also suppresses the electric field at the surface in the same manner as the edge electric field. This reduces the leakage current at the surface of the device.

Figure 7:
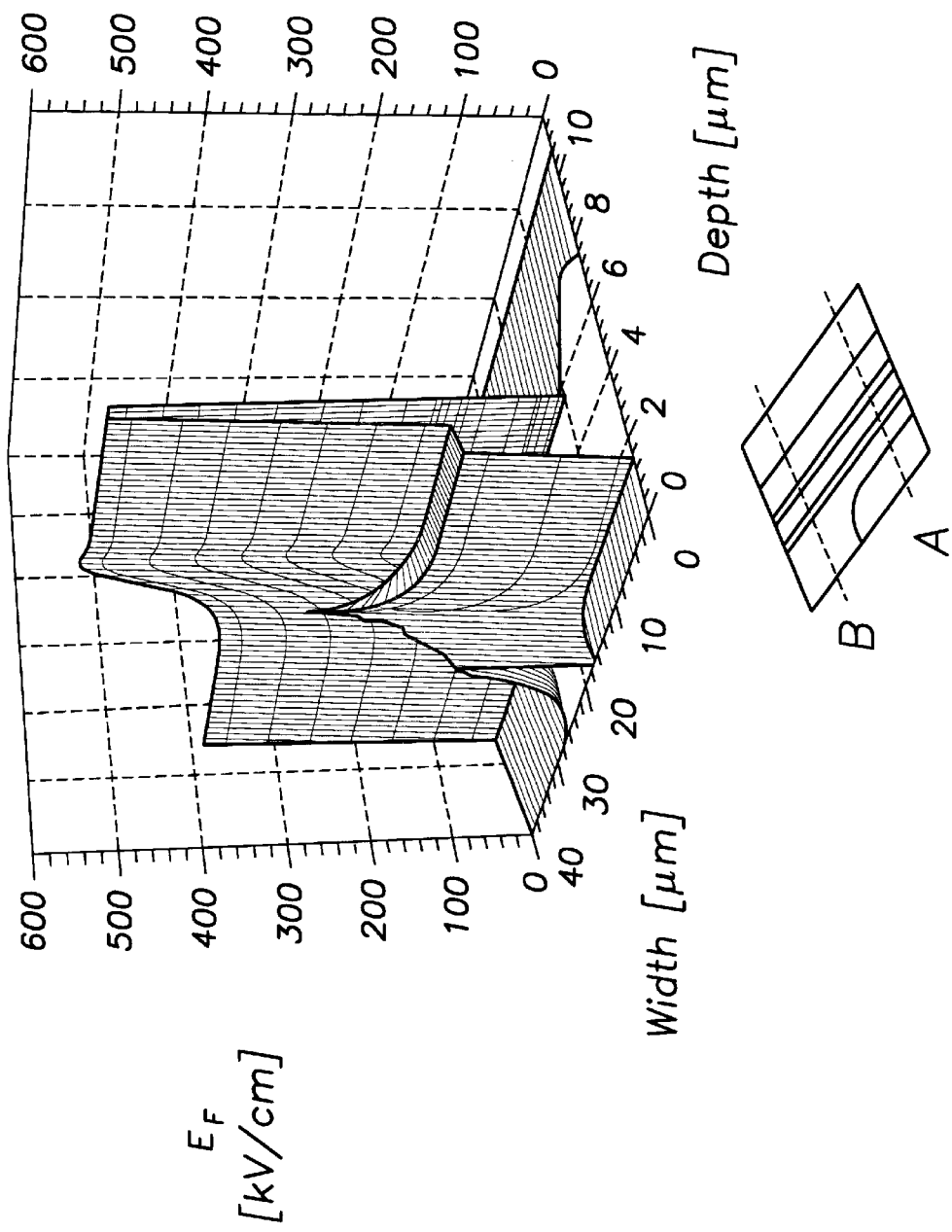
FIG. 7 is a is a graph of the carrier generation rate over a partial section of the avalanche photodiode shown in FIG. 2 under an applied negative bias of 59.3 V (i.e., breakdown).

At this point, the device is still not ready to operate in the avalanche photodiode mode. An essential component of avalanche photodiode designs is the establishment of an electric field in the absorption layer 34 large enough to accelerate the collection of the photogenerated carriers. In addition, this electric field must be kept small enough to prevent tunneling from occurring in the absorption layer 34. In this device, the p+ charge sheet is opened, exposing a p+ well. This condition well can now be used to selectively deplete the n+ charge sheet 30 and absorption layer 34 as the bias is increased. The majority of the n+ charge sheet depletion is confined to the section directly below the primary well 22. In this way, the well 22 carves an opening in the n+ charge sheet 30. Further increase in bias serves to extend this opening into the absorption layer 34, while establishing the electric field needed to accelerate the photogenerated carriers. Since the charge sheet 30 and the graded layer 32 must be opened and the selective opening of the graded layer 32 is dependent on the opening of the charge sheet 30, the device is said to have undergone a "joint opening effect" in order to reach the proper operating conditions. The resulting electric field magnitude is shown in FIG. 7. This figure reveals the formation of an electric field in the absorption layer 34 directly below the primary well 22. This electric field enhances the collection rate of the photogenerated carriers.

Figure 8:
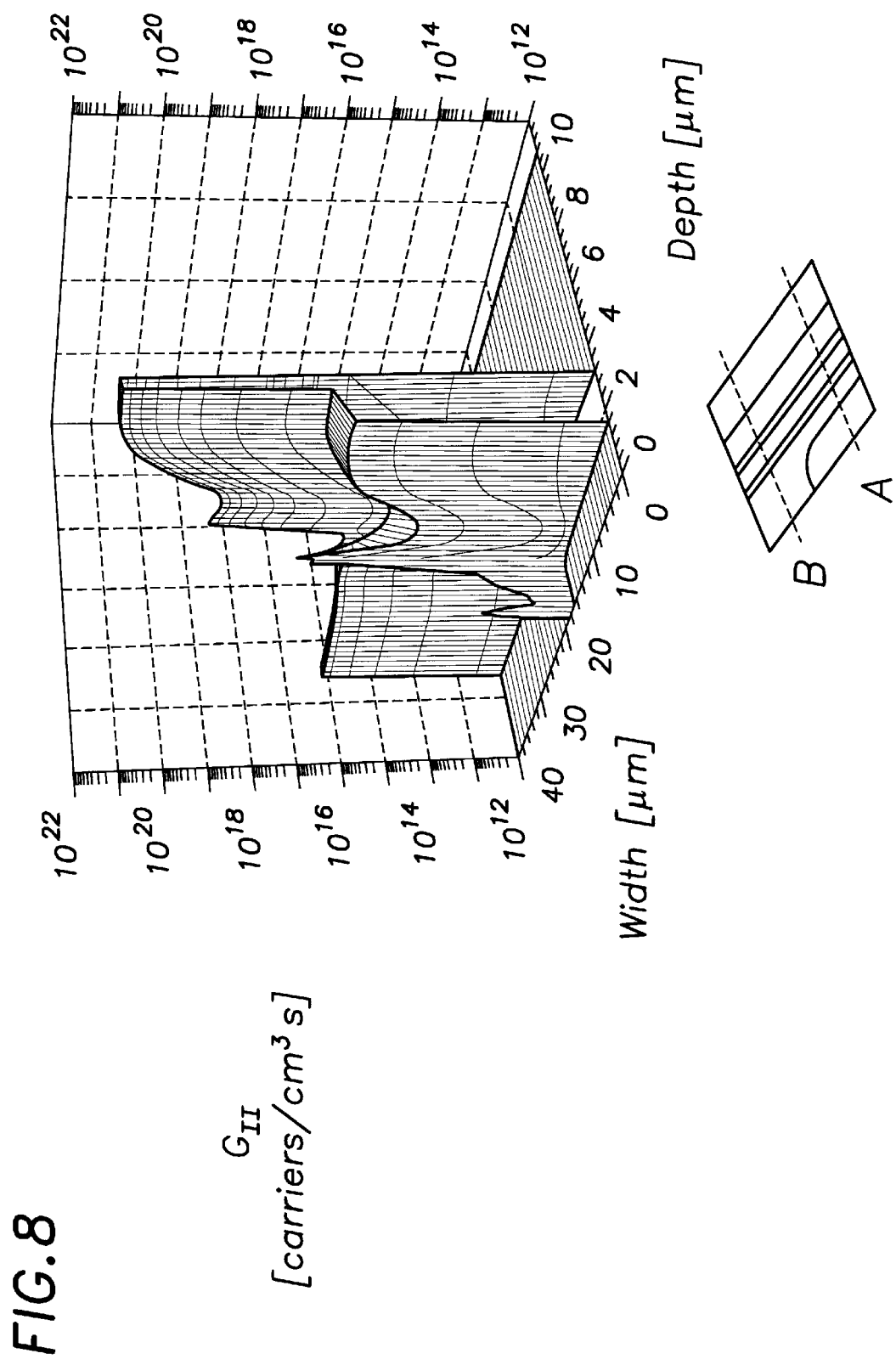
FIG. 8 is a is a graph of the impact ionization generation rate over a partial section of the avalanche photodiode shown in FIG. 2 at 59.3 V with a gain of 29.

Once the device is biased in the avalanche photodiode mode, it is important to establish the location of avalanche breakdown within the JOE avalanche photodiode 10. Knowledge of the electric field or the impact ionization coefficients alone is insufficient to determine whether the device is center or edge breakdown dominated. This is because the generation rate depends on both the ionization coefficients and the carrier flux. The generation rate is given by:

$$G = -\alpha_n \cdot \vec{J}_n - \alpha_p \cdot \vec{J}_p \qquad \text{[Equation 3]}$$

where $\alpha_{n,p}$ and $\vec{J}_{n,p}$ are the electron and hole ionization coefficients and current densities, respectively. Therefore, to determine whether the device is edge or center breakdown dominated, it is necessary to examine the impact ionization generation rate within the avalanche photodiode 10. The impact ionization generation rate is defined as the number of carriers produced per cm$^3$ per second. This rate is displayed in FIG. 8 for the JOE avalanche photodiode 10 with an applied biased of 59.3 V. This results in a gain of 29 and is chosen to define breakdown. The impact ionization generation rate of carriers can be used to determine what type of breakdown has occurred. Center breakdown is defined when the majority of the impact ionization induced carrier generation occurs in the active region. Edge breakdown is the case where the majority of the impact ionization occurs outside the active region. Integrating the generated charge in the active region and comparing it to the integrated charge outside the active region shows that 99.53% of the impact ionization generation occurs within the active region. Thus, this design is center breakdown dominated.

Figure 9:
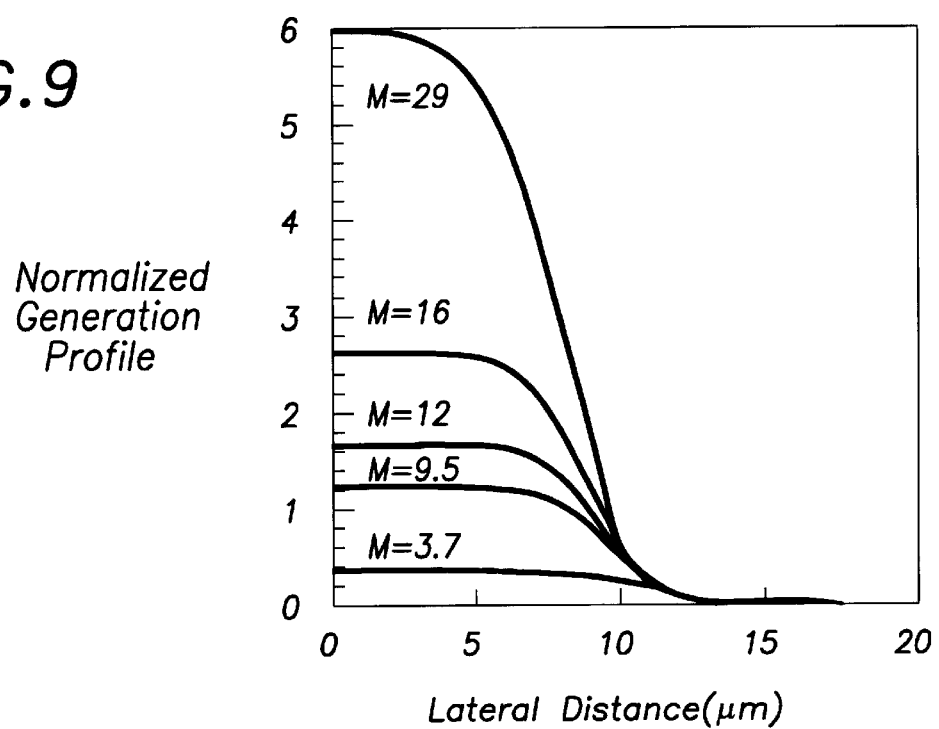
FIG. 9 is a graph of normalized generation profiles for a JOE avalanche photodiode at various voltages and gains.

Within a center breakdown dominant avalanche photodiode under high gain, the impact ionization generation peak can occur at the center or close to the edges of the active region. While both cases represent center breakdown, the case where the generation peak is in the center of the device is usually more desirable. This is because fiber optic cables are often aligned to the spot on the avalanche photodiode where the current is maximized. When the peak generation is at the center of the avalanche photodiode, the fiber will be positioned over the center of the active region. Alternatively, when the peak generation occurs near the perimeter of the active region, the fiber will be positioned away from the center, which reduces system performance and leads to increased noise. The normalized generation profile for the JOE avalanche photodiode 10 is shown in FIG. 9 for varying biases and subsequent gains. From inspection of FIG. 9, it is clear that the peak generation occurs at the center of the basic JOE avalanche photodiode 10. In addition, the uniformity of the profile is maintained over a large range of gains.

Figure 10:
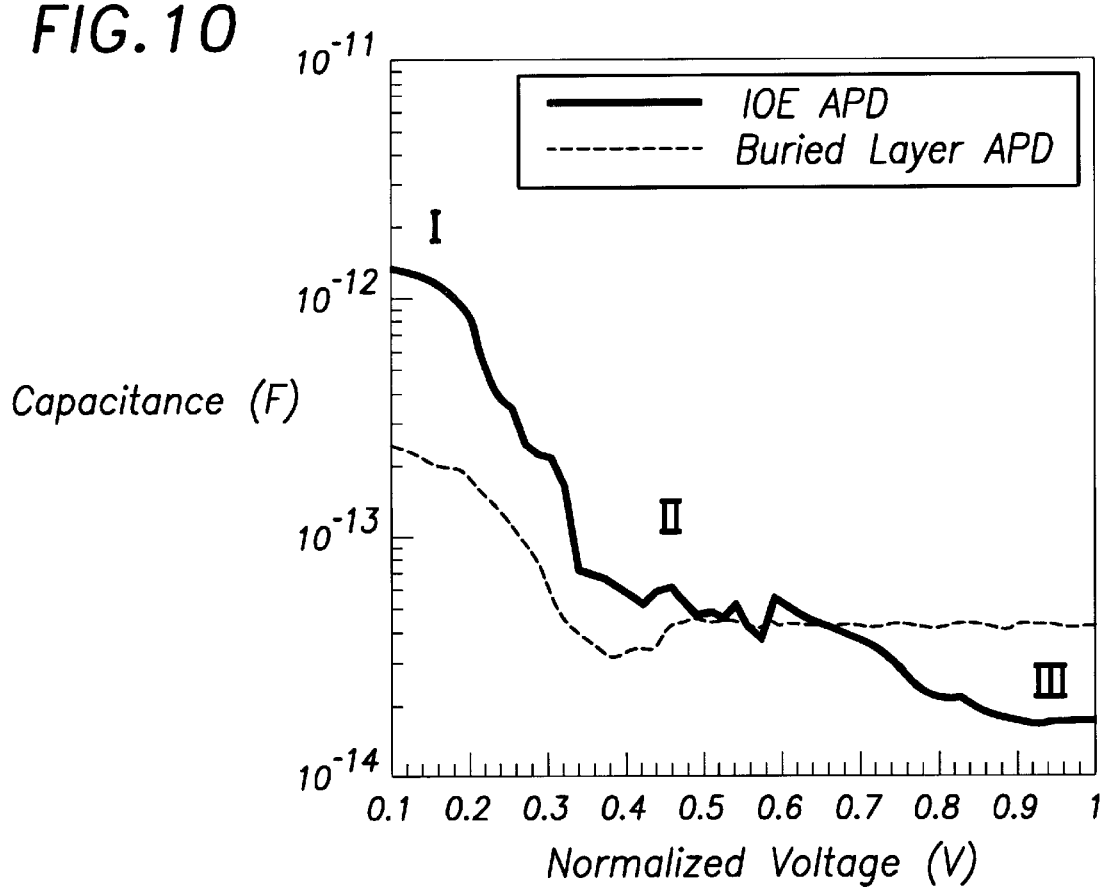
FIG. 10 is a is a graph of capacitance versus voltage for a JOE avalanche photodiode and a buried layer avalanche photodiode.

As mentioned earlier, the JOE avalanche photodiode 10 should have lower capacitance at the operating bias when compared to most other edge breakdown suppression mechanisms. To illustrate this point, a buried layer avalanche photodiode was simulated and compared with a JOE avalanche photodiode. Both devices had multiplication regions whose radius extends approximately 17 µm. In a buried layer avalanche photodiode, the multiplication region width is set by the width of the mesa charge sheet buried below the primary well. Here the primary well extends approximately 2 µm past the edge of the mesa charge sheet yielding a radius of approximately 19 µm. The 2 µm extension of the primary well is reasonable and is chosen to be less than the 4–5 µm extensions which have been reported for similar buried layer avalanche photodiodes. By comparison, the JOE avalanche photodiode has a primary well radius of only approximately 17 µm. The JOE avalanche photodiode has a smaller well radius because the multiplication region radius is defined by the radius of the primary well in JOE avalanche photodiodes. The current versus normalized capacitance is shown in FIG. 10. When the two avalanche photodiodes are biased under operating conditions (i.e., near breakdown), the JOE avalanche photodiode has a lower capacitance.

As discussed earlier, the JOE avalanche photodiode 10 of the present invention can be biased in three modes of operation. At low biases, prior to depletion of the p+ decoupler layer 26, the device is in Mode I. In this mode, the primary well 22 is not exposed so the capacitance is proportional to the radius of the p+ decoupler layer 26. This results in a large capacitance at low biases. This is illustrated in FIG. 10, where the JOE avalanche photodiode has a higher capacitance than the buried layer avalanche photodiode. As the bias is increased, the p+ decoupler layer 26 is depleted. This marks the onset of Mode II operation. As the lightly doped p-type region surrounding the primary well 22 depletes, the capacitance is reduced since the distance between the p− and n+ layer is increased. This continues until the p-background doping is fully depleted and the primary well 22 is totally exposed. At this point, the capacitance levels off and is proportional to the radius of the primary well 22. Increasing the bias further results in the depletion of the n+ charge sheet 30 and n absorption layer 34 directly below the primary well 22. At this point, the device is operating in Mode III. Given that the capacitance is inversely proportional to the depth of the depletion below the primary well, the capacitance is further reduced in Mode III.

Since the joint opening effect provides for a new family of avalanche photodiode designs, it is useful to examine the design requirements of the p+ decoupling layer and the p-background region. Significant fluctuations in the doping level and thickness of the decoupler layer 26 can produce variations in the breakdown voltage, gain non-uniformity, edge breakdown, and tunneling in the absorption layer 34. For the device shown in FIG. 2, edge breakdown suppression and gain uniformity were maintained without any tunneling in the absorption layer 34 when the p+ multiplication layer 28 was varied by ±20%. Over this range of doping variations, the breakdown voltage varied by approximately ∓13%. The exact value of the lightly doped p-type region surrounding the p+ well 22 is not critical. The p-doping in this region should be low enough to ensure that this region is fully depleted when biased for the desired gain. In addition, there is the issue of interface states at the depleted surface. This effect can be minimized by passivating the surface of the avalanche photodiode.

Figure 11:
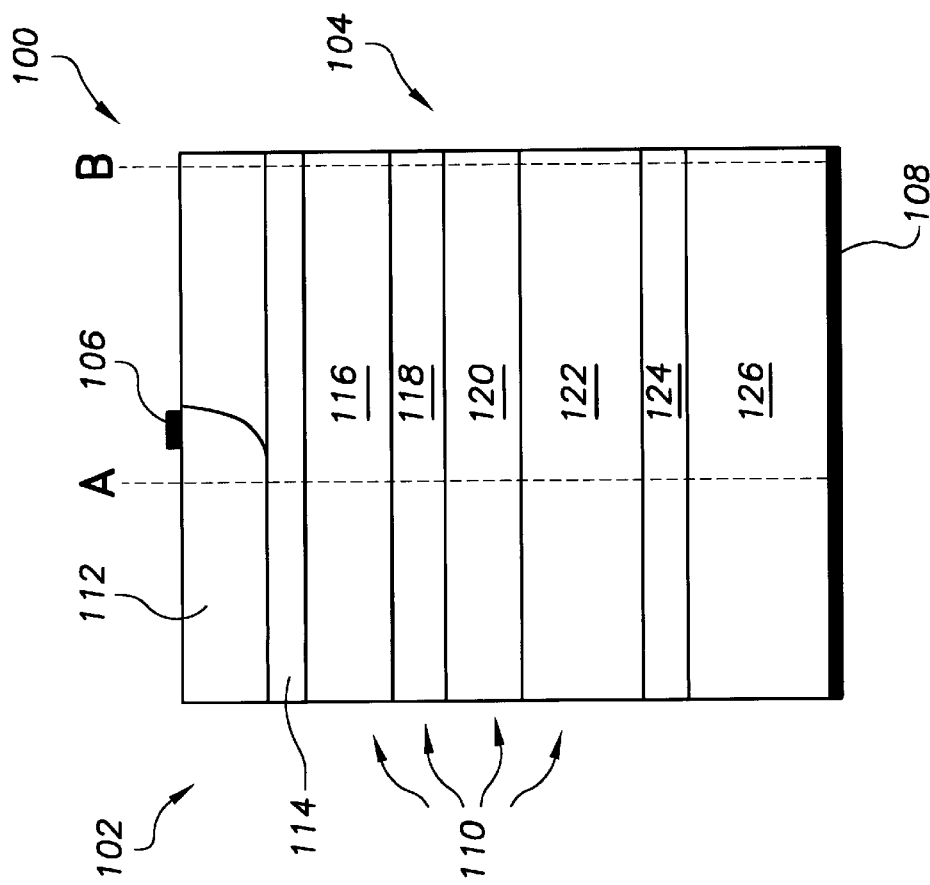
FIG. 11 is a partial cross-sectional view of an avalanche photodiode constructed in accordance with the principles of the present invention which is optimized for frequency response.

As known in the art, avalanche build-up time can reduce the frequency response of the device. This build-up time is, in part, a function of the thickness of the device. The thicker the device (and its individual layers), the greater the distance that the carriers must travel. Therefore, in applications in which the edge suppression characteristics described above are desired along with maximum frequency response, it may be advantageous to reduce the thickness of the avalanche photodiode. This can either be accomplished by reducing the size of one or more layers of the photodiode or by removing one or more of its layers. FIG. 11 illustrates an embodiment of an avalanche photodiode 100 which is optimized for frequency response. As indicated in this figure, the avalanche photodiode 100, like the photodiode 10 shown in FIG. 2, comprises an axial center 102, a peripheral edge 104, a p contact 106, and an n contact 108. In addition, the photodiode 100 comprises a plurality of photodiode layers 110 which are disposed in a predetermined order. In the avalanche photodiode 100 shown in FIG. 11, however, no separator layer is provided. Accordingly, the various layers 110 of the device comprise, in order from the p contact 106 to the n contact 108, a primary well 112, a decoupler layer 114, a multiplication layer 116, a charge sheet 118, a graded layer 120, an absorption layer 122, a buffer layer 124, and a substrate 126.

As with the avalanche photodiode 10 shown in FIG. 2, the avalanche photodiode 100 of FIG. 11 is preferably formed as an InGaAs-InP photodiode in which each of the primary well 112, decoupler layer 114, multiplication layer 116, charge sheet 118, buffer layer 124, and substrate 126 comprise InP, and the absorption layer 122 comprises InGaAs. The graded layer 120 is formed by any of the methods consistent with the art for grading from InP to InGaAs. Furthermore, the relationship of volumes of charge described in the foregoing with respect to the avalanche photodiode 10 apply equally to the avalanche photodiode 100 so that the depletion progression and sequence described in the foregoing can be achieved to obtain the joint opening effect also described above. Therefore, the arrangement shown in FIG. 11 allows for improved frequency response while still providing effective edge suppression.

Figure 12:
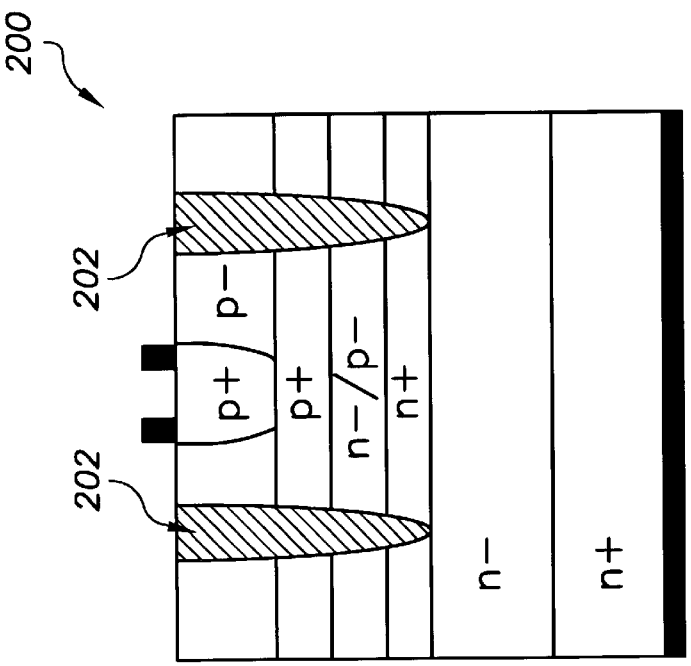
FIG. 12 is a full cross-sectional view of an avalanche photodiode constructed in accordance with the principles of the present invention which includes a channel stop.

In another arrangement, the avalanche photodiode can be provided with a plurality of channel stops so that an array of photodiodes can be formed on a single chip. FIG. 12 illustrates one example of such an arrangement. In this figure, depicted is an avalanche photodiode 200 in full cross-section. As is apparent from this figure, the photodiode 200 is provided with an annular channel stop 202 which is used to segregate the photodiode from other components (e.g., other photodiodes in an array) which may be formed within the chip. Such a channel stop 202 typically must be diffused deep enough to compensate for the p+ decoupler layer 114. This allows for the isolation of individual avalanche photodiodes and prevents the formation of high electric fields at the sidewalls of each avalanche photodiode.

The joint opening effect described in the foregoing offers simpler implementation than competing methods. With the joint opening effect, the photodiode design does not alter the well geometry like designs relying on dual diffusion or guard ring techniques, nor does it rearrange the equipotential region around the well edge like floating guard ring designs. In addition, this technique does not rely on the inclusion of a charged disc smaller than the primary well to establish center breakdown dominance like two tiered mesa structures. Accordingly, the joint opening effect represents a new methodology for edge breakdown suppression. This technique temporarily decouples the electric field in the active region from the primary well. In this manner, the electric field in the active region grows undisturbed by the geometry of the primary well over a portion of the applied bias.

In addition, in that the edge breakdown suppression mechanism in the basic implementation of the JOE avalanche photodiode is produced during the growth process and consists of growing a charge sheet and setting the background dopant type of the top layer, JOE avalanche photodiode does not depend on such things as the diffusion or implementation of carriers, proper mask alignment, or variations in guard ring window sizes. In addition, since the formation of an electric field occurs deeper within the device away from the surface in the JOE design, the peak electric field at the surface is reduced. This is important because high electric fields at the semiconductor-insulator interface are a source of leakage currents.

Furthermore, the aforementioned capacitance problems encountered in the prior art do not occur in the JOE design since the primary well size is only determined by the desired size of the active area. This leads to reduced capacitances for comparable JOE avalanche photodiodes. In addition the well area, the distance of the well from the multiplication region can be varied. This is not possible with other edge breakdown suppression techniques. Increasing the separation distance between the primary well and the multiplication region results in a decrease in the avalanche photodiode's capacitance. This will allow for the fabrication of wide-area avalanche photodiode's with less capacitance.

When used in conjunction with other edge breakdown suppression techniques, the joint opening effect can have a significant affect on avalanche photodiode designs. Well depths can be made shallower, thereby reducing the surface area of the wall. The primary well can also be ion-implanted. Shallower primary wells allow for lower energy implantation of guard rings, which results in less damage to the material. Guard rings can also be formed by diffusion instead of relying on more expensive implantation processes. Moreover, the tolerance constrains associated with the customary suppression techniques discussed earlier are relaxed when the joint opening effect is included.

While particular embodiments of the invention have been disclosed in detail in the foregoing description and drawings for purposes of example, it will be understood by those skilled in the art that variations and modifications thereof can be made without departing from the spirit and scope of the invention as set forth in the following claims.

What is claimed is:

1. An avalanche photodiode having edge breakdown suppression, comprising:
   a p contact and an n contact; and
   a plurality of device layers disposed between said p contact and said n contact including, in order from said p contact to said n contact, a primary well, a decoupler layer, a multiplication layer, a charge sheet, an absorption layer, and a substrate;
   wherein said multiplication layer has a volume of charge less than that of said decoupler layer and said decoupler layer has a volume of charge less than that of said charge sheet, such that said multiplication layer will deplete before said decoupler layer and said decoupler layer will deplete before said charge sheet when a negative bias is applied to said avalanche photodiode.

2. The avalanche photodiode of claim 1, wherein said multiplication layer has a dopant concentration less than that of said decoupler layer and said decoupler layer has a dopant concentration less than that of said charge sheet.

3. The avalanche photodiode of claim 1, further comprising a separator layer disposed between said primary well and said decoupler layer.

4. The avalanche photodiode of claim 3, wherein said separator layer has a volume of charge that is substantially less than that of said primary well.

5. The avalanche photodiode of claim 1, further comprising a graded layer disposed between said charge sheet and said absorption layer.

6. The avalanche photodiode of claim 5, wherein said graded layer has a volume of charge that is less than that of said charge sheet.

7. The avalanche photodiode of claim 1, further comprising a buffer layer disposed between said absorption layer and said substrate.

8. The avalanche photodiode of claim 7, wherein said volume of charge of said buffer layer is substantially equal to that of said absorption layer.

9. The avalanche photodiode of claim 1, wherein said avalanche photodiode is an InGaAs-InP photodiode.

10. The avalanche photodiode of claim 1, further including at least one channel stop which segregates said avalanche photodiode.

11. An avalanche photodiode having edge breakdown suppression, comprising:
    a p contact and an n contact; and
    a plurality of device layers disposed between said p contact and said n contact including, in order from said p contact to said n contact, a primary well, a separator layer, a decoupler layer, a multiplication layer, a charge sheet, a graded layer, an absorption layer, a buffer layer, and a substrate;
    wherein said multiplication layer has a volume of charge less than that of said decoupler layer and said decoupler layer has a volume of charge less than that of said charge sheet, such that said multiplication layer will deplete before said decoupler layer and said decoupler layer will deplete before said charge sheet when a negative bias is applied to said avalanche photodiode.

12. The avalanche photodiode of claim 11, wherein said multiplication layer has a dopant concentration less than that of said decoupler layer and said decoupler layer has a dopant concentration less than that of said charge sheet.

13. The avalanche photodiode of claim 11, wherein said multiplication layer, said separator layer, said absorption layer, and said buffer layer each has a dopant concentration that is substantially equal in magnitude.

14. The avalanche photodiode of claim 11, wherein said graded layer has a dopant concentration that is larger than that of said multiplication layer but less than that of said decoupler layer.

15. The avalanche photodiode of claim 11, wherein said avalanche photodiode is an InGaAs-InP photodiode.

16. The avalanche photodiode of claim 11, further including at least one channel stop which segregated said avalanche photodiode.

* * * * *

UNITED STATES PATENT AND TRADEMARK OFFICE
CERTIFICATE OF CORRECTION

PATENT NO. : 6,359,322 B1
DATED : March 19, 2002
INVENTOR(S) : Haralson et al.

It is certified that error appears in the above-identified patent and that said Letters Patent is hereby corrected as shown below:

Column 2,
Line 46, delete "dependant" and insert -- dependent -- therefor;

Column 4,
Lines 16, 19, 22 and 28, delete "is a" (second occurrence);

Column 6,
Line 6, delete "that" and insert -- than -- therefor;

Column 12,
Line 57, delete "segregated" and insert -- segregates -- therefor.

Signed and Sealed this

Fourth Day of June, 2002

*Attest:*

JAMES E. ROGAN
*Attesting Officer*     *Director of the United States Patent and Trademark Office*